(12) United States Patent
Kang et al.

(10) Patent No.: US 10,468,400 B2
(45) Date of Patent: Nov. 5, 2019

(54) METHOD OF MANUFACTURING SUBSTRATE STRUCTURE

(71) Applicant: SAMSUNG ELECTRONICS CO., LTD., Suwon-si, Gyeonggi-do (KR)

(72) Inventors: Pil Kyu Kang, Hwaseong-si (KR); Seok Ho Kim, Hwaseong-si (KR); Tae Yeong Kim, Yongin-si (KR); Kwang Jin Moon, Hwaseong-si (KR); Ho Jin Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/869,808

(22) Filed: Jan. 12, 2018

(65) Prior Publication Data

US 2018/0226390 A1 Aug. 9, 2018

(30) Foreign Application Priority Data

Feb. 3, 2017 (KR) .................. 10-2017-0015412

(51) Int. Cl.
*H01L 25/00* (2006.01)
*H01L 25/065* (2006.01)
(Continued)

(52) U.S. Cl.
CPC ............ *H01L 25/50* (2013.01); *H01L 21/187* (2013.01); *H01L 21/76898* (2013.01); *H01L 24/92* (2013.01); *H01L 24/94* (2013.01); *H01L 25/0657* (2013.01); *H01L 24/80* (2013.01); *H01L 2224/02372* (2013.01); *H01L 2224/08145* (2013.01); *H01L 2224/16145* (2013.01);
(Continued)

(58) Field of Classification Search
CPC ....... H01L 25/50; H01L 21/187; H01L 24/92; H01L 24/94; H01L 25/0657; H01L 21/76898; H01L 2224/94; H01L 2224/08145; H01L 2224/16145; H01L 2224/9202; H01L 2224/80896; H01L 2224/80895; H01L 2224/80048; H01L 2224/73204; H01L 2224/17181; H01L 2224/16146; H01L 2225/06513; H01L 2224/8012; H01L 2224/80047; H01L 2224/80894; H01L 2225/06593; H01L 2225/06568; H01L 2225/06541; H01L 2225/06524; H01L 24/80
See application file for complete search history.

(56) References Cited

U.S. PATENT DOCUMENTS

| 5,013,687 A | 5/1991 | Solomon |
| 5,036,580 A | 8/1991 | Fox et al. |

(Continued)

FOREIGN PATENT DOCUMENTS

JP 2010-157670 A 7/2010

*Primary Examiner* — Edward Chin
(74) *Attorney, Agent, or Firm* — Lee & Morse, P.C.

(57) ABSTRACT

A method of manufacturing a substrate structure includes providing a first substrate including a first device region on a first surface, providing a second substrate including a second device region on a second surface, such that a width of the first device region is greater than a width of the second device region, and bonding the first substrate and the second substrate, such that the first and second device regions are facing each other and are electrically connected to each other.

19 Claims, 20 Drawing Sheets

(51) Int. Cl.
*H01L 21/768* (2006.01)
*H01L 21/18* (2006.01)
*H01L 23/00* (2006.01)

(52) U.S. Cl.
CPC .............. *H01L 2224/16146* (2013.01); *H01L 2224/17181* (2013.01); *H01L 2224/293* (2013.01); *H01L 2224/2929* (2013.01); *H01L 2224/73204* (2013.01); *H01L 2224/8012* (2013.01); *H01L 2224/80047* (2013.01); *H01L 2224/80048* (2013.01); *H01L 2224/80894* (2013.01); *H01L 2224/80895* (2013.01); *H01L 2224/80896* (2013.01); *H01L 2224/9202* (2013.01); *H01L 2224/94* (2013.01); *H01L 2225/06513* (2013.01); *H01L 2225/06524* (2013.01); *H01L 2225/06541* (2013.01); *H01L 2225/06568* (2013.01); *H01L 2225/06593* (2013.01); *H01L 2924/3512* (2013.01)

(56) References Cited

U.S. PATENT DOCUMENTS

| | | | |
|---|---|---|---|
| 5,455,455 A | 10/1995 | Badehi | |
| 5,478,781 A | 12/1995 | Bertin et al. | |
| 5,656,552 A | 8/1997 | Hudak et al. | |
| 5,656,553 A | 8/1997 | Leas et al. | |
| 5,771,571 A | 6/1998 | Voldman et al. | |
| 5,789,278 A | 8/1998 | Akram et al. | |
| 6,040,618 A | 3/2000 | Akram | |
| 6,462,399 B1 | 10/2002 | Akram | |
| 6,623,596 B1 | 9/2003 | Collins et al. | |
| 6,822,316 B1 | 11/2004 | Hsuan | |
| 6,906,415 B2 | 6/2005 | Jiang et al. | |
| 6,945,701 B2 | 9/2005 | Trezza et al. | |
| 7,198,980 B2 | 4/2007 | Jiang et al. | |
| 7,215,018 B2 | 5/2007 | Vindasius et al. | |
| 7,166,487 B2 | 6/2007 | Takada et al. | |
| 7,245,021 B2 | 7/2007 | Vindasius et al. | |
| 7,344,903 B2 | 3/2008 | Erchank et al. | |
| 7,535,109 B2 | 5/2009 | Robinson et al. | |
| 7,560,801 B2 | 7/2009 | Ossimitz | |
| 7,659,612 B2 | 2/2010 | Hembree et al. | |
| 7,859,102 B2 | 12/2010 | Kim et al. | |
| 7,883,991 B1 | 2/2011 | Wu et al. | |
| 7,977,145 B2 | 7/2011 | Hannebauer | |
| 8,247,895 B2 | 8/2012 | Haensch et al. | |
| 8,298,916 B2 | 10/2012 | Vaufredaz et al. | |
| 8,357,999 B2 | 1/2013 | Robinson et al. | |
| 8,585,847 B2 | 11/2013 | Suzuki et al. | |
| 8,679,944 B2 * | 3/2014 | Broekaart | H01L 21/304 257/E21.237 |
| 8,703,508 B2 | 4/2014 | Chang et al. | |
| 9,105,827 B2 | 8/2015 | Pham et al. | |
| 9,136,231 B2 | 9/2015 | Guo et al. | |
| 9,214,434 B1 | 12/2015 | Kim et al. | |
| 9,259,902 B2 | 2/2016 | Yu et al. | |
| 9,343,499 B1 | 5/2016 | Tai et al. | |
| 9,346,242 B2 | 5/2016 | Nagayama et al. | |
| 2001/0055863 A1 * | 12/2001 | Nakano | H01L 21/2007 438/549 |
| 2002/0027294 A1 * | 3/2002 | Neuhaus | G06K 19/07752 257/778 |
| 2004/0021230 A1 | 2/2004 | Tsai et al. | |
| 2004/0121556 A1 * | 6/2004 | Kim | H01L 23/481 438/455 |
| 2005/0051895 A1 | 3/2005 | Kim et al. | |
| 2005/0148160 A1 | 7/2005 | Farnworth et al. | |
| 2007/0072393 A1 * | 3/2007 | Aspar | H01L 21/304 438/459 |
| 2008/0000521 A1 | 1/2008 | Sivoththaman et al. | |
| 2008/0116572 A1 | 5/2008 | Baek et al. | |
| 2008/0128864 A1 | 6/2008 | Cho | |
| 2008/0230913 A1 | 9/2008 | Huang et al. | |
| 2008/0258306 A1 * | 10/2008 | Chang | H01L 21/6835 257/762 |
| 2009/0042363 A1 * | 2/2009 | Miyazaki | H01L 21/304 438/459 |
| 2009/0051043 A1 | 2/2009 | Wong et al. | |
| 2009/0127686 A1 | 5/2009 | Yang et al. | |
| 2009/0309114 A1 | 12/2009 | Lu et al. | |
| 2013/0334680 A1 | 12/2013 | Boone et al. | |
| 2015/0115986 A1 | 4/2015 | Wang et al. | |
| 2015/0332983 A1 * | 11/2015 | Honda | C09J 11/06 257/773 |
| 2016/0005686 A1 | 1/2016 | Yu et al. | |
| 2016/0027760 A1 | 1/2016 | Yu et al. | |
| 2016/0174355 A1 | 6/2016 | Lal et al. | |
| 2017/0243855 A1 * | 8/2017 | Kim | H01L 23/3128 |

* cited by examiner

METHOD OF MANUFACTURING SUBSTRATE STRUCTURE

CROSS-REFERENCE TO RELATED APPLICATION

Korean Patent Application No. 10-2017-0015412 filed on Feb. 3, 2017, in the Korean Intellectual Property Office, and entitled: "Method of Manufacturing Substrate Structure," is incorporated by reference herein in its entirety.

BACKGROUND

1. Field

The present disclosure relates to a method of manufacturing a substrate structure, and, more particularly, to a method of laminating a plurality of substrates.

2. Description of the Related Art

Many wafers may include a bevel edge caused by a wafer thinning process. When mechanical stress and thermal stress generated by a semiconductor device manufacturing process are applied to a wafer, a bevel may cause non-uniform stress to be added to an edge of the wafer. As a result, wafer crack and delamination may be induced. Therefore, it is required to remove the bevel edge through a wafer edge trimming process.

SUMMARY

According to an exemplary embodiment of the present disclosure, a method of manufacturing a substrate structure includes providing a first substrate including a first surface and a second surface, facing each other, and a first device region formed on the first surface, providing a second substrate including a third surface and a fourth surface, facing each other, and a second device region formed on the third surface, bonding the first substrate and the second substrate to electrically connect the first device region and the second device region, and reducing a thickness of the second substrate, after bonding the first and second substrates, wherein a width of the first device region is greater than a width of the second device region in a state where the first substrate is bonded with the second substrate whose thickness is reduced.

According to another exemplary embodiment of the present disclosure, a method of manufacturing a substrate structure includes providing a first substrate including a first device region formed on a first surface, providing a second substrate including a second device region formed on a first surface, in which a width of the second device region is smaller than a width of the first device region, directly bonding the first surface of the first substrate and the second surface of the second substrate such that the first device region and the second device region face each other, and reducing a thickness of the second substrate bonded with the first substrate to form a first substrate structure.

According to another exemplary embodiment of the present disclosure, a method of manufacturing a substrate structure includes providing a first substrate including a first device region on a first surface, providing a second substrate including a second device region on a second surface, such that a width of the first device region is greater than a width of the second device region, and bonding the first substrate and the second substrate, such that the first and second device regions are facing each other and are electrically connected to each other.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, preferred embodiments of the present disclosure will be described with reference to the attached drawings.

FIGS. 1-8, 9A, 9B, and 10-12 are intermediate views for illustrating a method of manufacturing a substrate structure according to some embodiments of the present disclosure. For reference, FIG. 2 is an enlarged view of region P in FIG. 1, and FIG. 7 is an enlarged view of region Q in FIG. 6.

Figure 1:
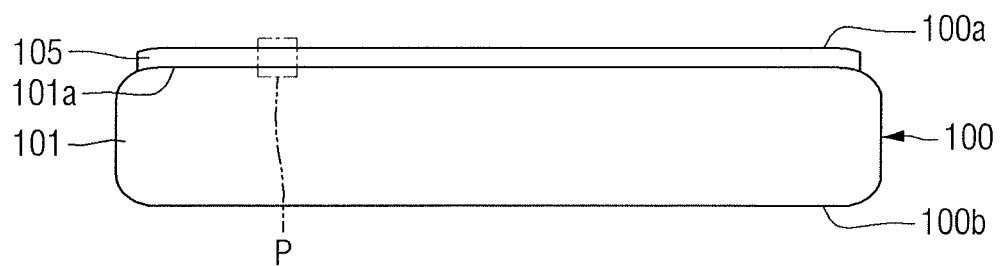
FIGS. 1-8, 9A, 9B, and 10-12 illustrate intermediate views of stages in a method of manufacturing a substrate structure according to some embodiments.
Figure 2:
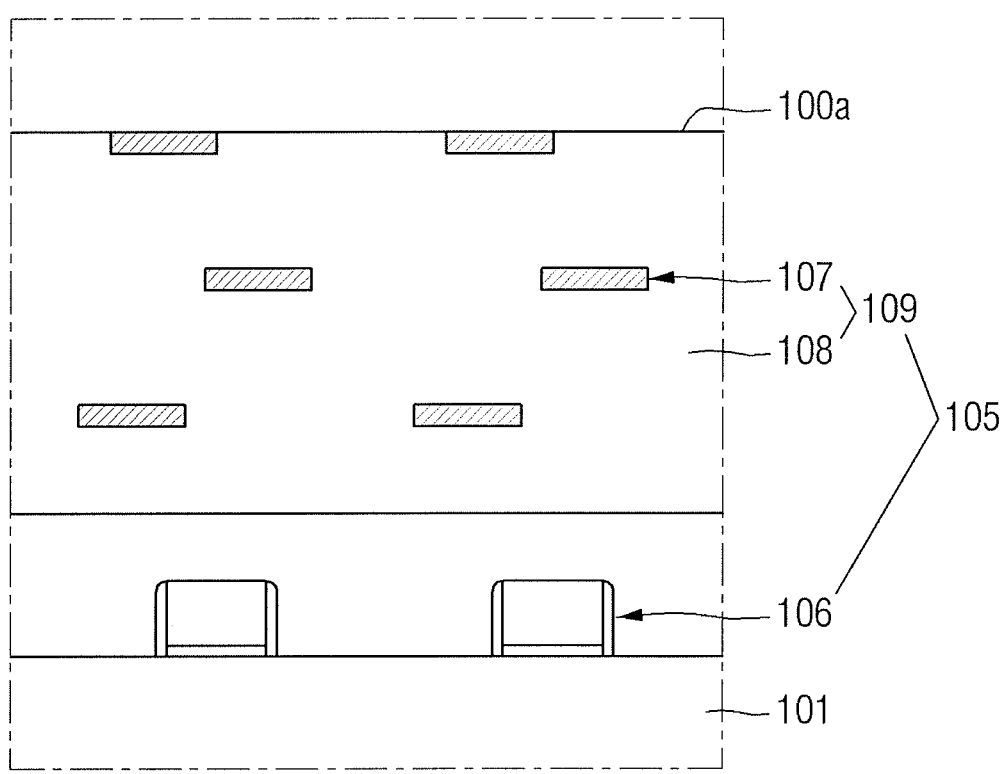

Referring to FIGS. 1 and 2, a first substrate 100 including a first device region 105 may be provided. The first substrate 100 may include a first surface 100*a* and a second surface 100*b*, which face each other. The first substrate 100 may include a first base substrate 101 and a first device region 105 formed on the first base substrate 101.

The first device region 105 may be formed, e.g., directly, on the first surface 100*a* of the first substrate 100. That is, the first surface 100*a* of the first substrate 100 may be defined by the first device region 105.

The first device region 105 may be formed on a first surface 101*a* of the first base substrate 101. A second surface of the first base substrate 101, facing the first surface 101*a* of the first base substrate 101, may be the second surface 100*b* of the first substrate 100. Although it is shown in FIG. 1 that the first device region 105 is not formed at the bevel edge of the first base substrate 101, this is only for convenience of explanation, and is not limited thereto.

The first substrate 100 may include a plurality of die regions that may be a logic chip or a memory chip through a dicing process. When the first substrate 100 includes die regions to be a logic chip, the first device region 105 included in the first substrate 100 may be designed in various ways in consideration of operations to be performed.

When the first substrate 100 includes die regions to be a memory chip, the first device region 105 included in the first substrate 100 may include a device pattern for non-volatile memory or volatile memory. For example, when the memory chip is a volatile memory chip, the memory chip may include dynamic random access memory (DRAM). When the memory chip is a non-volatile memory chip, the memory chip may be a flash memory chip, e.g., any one of a NAND flash memory chip and a NOR flash memory chip. However, the type of the memory device according to the technical idea of the present disclosure is not limited thereto. In some embodiments, the flash memory chip may include any one of phase-change random access memory (PRAM), magneto-resistive random access memory (MRAM), and resistive random access memory (RRAM).

For example, the first base substrate 101 may be a bulk silicon plate or a silicon-on-insulator (SOI). In another example, the first base substrate 101 may be a silicon plate, and may be a plate containing another material, e.g., silicon germanium, silicon germanium on insulator (SGOI), indium antimonide, a lead tellurium compound, indium arsenide, indium phosphide, gallium arsenide, or gallium antimonide. However, the present disclosure is not limited thereto.

For example, referring to FIG. 2, the first device region 105 may include a circuit pattern 106 and a first wiring structure 109. Although it is shown in the drawings that the circuit pattern 106 is formed on the first base substrate 101, the present disclosure is not limited thereto. The circuit pattern 106 may also be formed in the first base substrate 101.

The first wiring structure 109 may be formed on the circuit pattern 106. The first wiring structure 109 includes a first interlayer insulating film 108 and a first wiring 107 formed in the first interlayer insulating film 108. The first wiring 107 may be electrically connected with the circuit pattern 106.

In another example, a part of the first device region 105 formed on the first surface 101a of the first base substrate 101 may not include the circuit pattern 106 and/or the first wiring 107. For example, the first device region formed adjacent to the bevel edge of one surface 101a of the base substrate 101 may not include the circuit pattern 106 and/or the first wiring 107.

Figure 3:
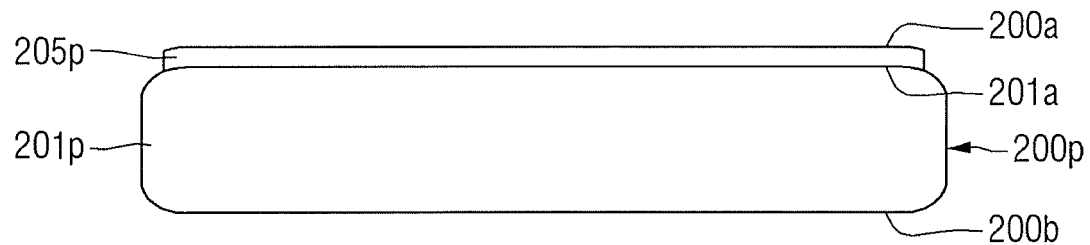

Referring to FIG. 3, a pre-substrate 200p including a pre-device region 205p may be provided.

The pre-substrate 200p may include a first surface 200a and a second surface 200b, which face each other. The pre-substrate 200p may include a pre-base substrate 201p and a pre-device region 205p formed on the pre-base substrate 201p. The pre-device region 205p may be formed on the first surface 200a of the pre-substrate 200p. That is, the first surface 200a of the pre-substrate 200p may be defined by the pre-device region 205p.

The pre-device region 205p may be formed on a first surface 201a of the pre-base substrate 201p. A second surface of the pre-base substrate 201p, facing the first surface 201a of the pre-base substrate 201p, may be the second surface 200b of the pre-substrate 200p. Although it is shown in FIG. 3 that the pre-device region 205p is not formed at the bevel edge of the second base substrate 201, this is only for convenience of explanation, and is not limited thereto.

The pre-substrate 200p may include a plurality of die regions that may be a logic chip or a memory chip through a dicing process. Like the first device region 105, the pre-device region 205p may also include a circuit pattern and a wiring structure.

Figure 4:
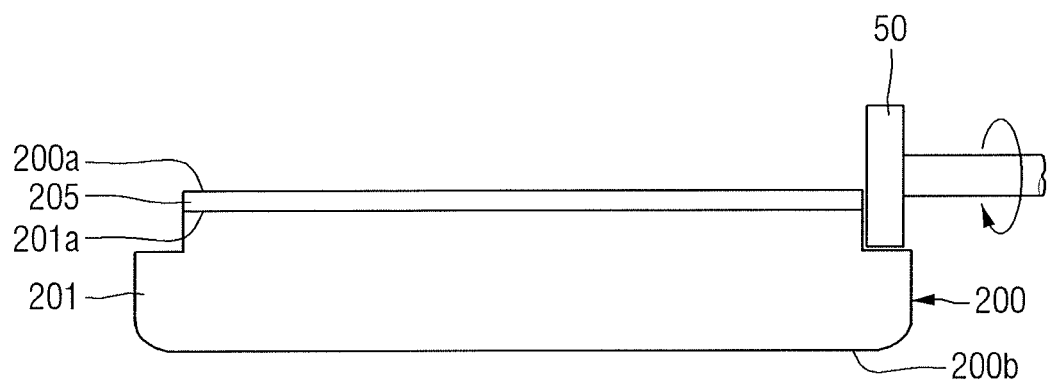

Referring to FIG. 4, a second substrate 200 may be formed by trimming a part of the pre-base substrate 201p and a part of the pre-device region 205p. Through the trimming, a part of the edge of the pre-base substrate 201p may be removed in the thickness direction of the pre-base substrate 201p. Further, through the trimming, the pre-device region 205p formed at the edge of the pre-base substrate 201p may be removed. Accordingly, a second device region 205 may be formed on a second base substrate 201.

For example, a part of the pre-base substrate 201p and a part of the pre-device region 205p may be mechanically trimmed. That is, a part of the pre-base substrate 201p and a part of the pre-device region 205p may be mechanically removed. The mechanical trimming may be performed using a blade 50. Through the trimming, a step that is recessed toward the second surface 200b of the second substrate 200 from the first surface 201a of the second base substrate 201 may be formed. For example, as illustrated in FIG. 4, the trimming of the pre-base substrate 201p and the pre-device region 205p may be performed such that lateral edges of the second device region 205 may be level, e.g., coplanar, with those of the second base substrate 201 to define a step structure.

The second substrate 200 may include the first surface 200a and the second surface 200b, which face each other. The second substrate 200 may include the second base substrate 201 and the second device region 205 formed, e.g., directly, on the second base substrate 201.

The first surface 200a of the second substrate 200 may be defined by the second device region 205. The second device region 205 may be formed on the first surface 201a of the second base substrate 201. The second surface 200b of the second base substrate 201, facing the first surface 201a of the second base substrate 201, may be the second surface 200b of the second substrate 200. Through the trimming process, there may be the second substrate 200 including the first surface 200a of the second substrate 200 and the second surface 200b of the second substrate 200, and the second device region 205.

Figure 5:
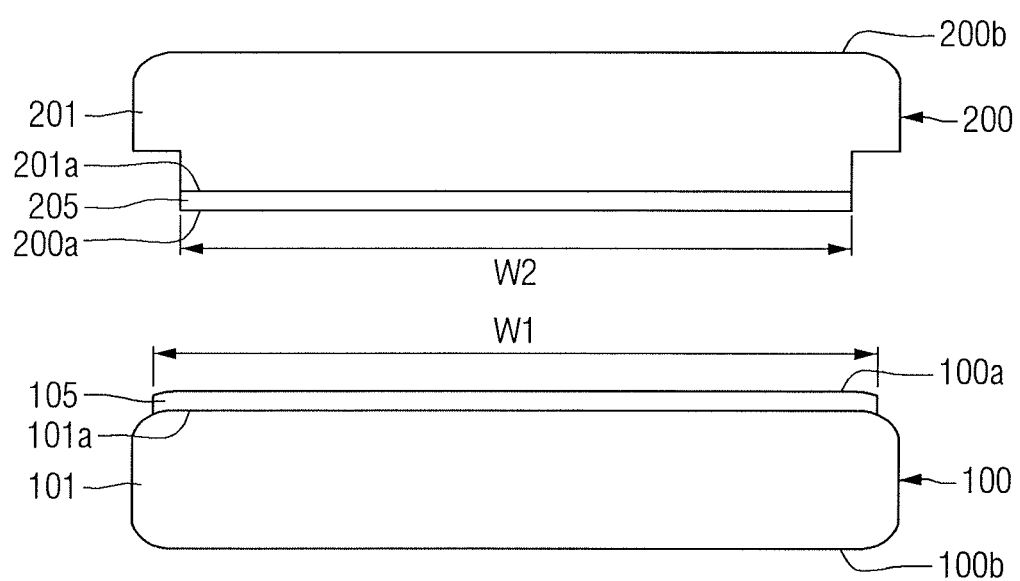

Referring to FIG. 5, the first substrate 100 and the second substrate 200 may be disposed such that the first surface 100a of the first substrate 100 and the first surface 200a of the second substrate 200 face each other. The first substrate 100 and the second substrate 200 may be disposed such that the first device region 105 formed on the first surface 100a of the first substrate 100 and the second device region 205 formed on the first surface 200a of the second substrate 200 face each other.

In the method of manufacturing a substrate structure according to some embodiments of the present disclosure, a width W1 of the first device region 105 and a width W2 of the second device region 205 may be different from each other. For example, the width W1 of the first device region 105 may be greater than the width W2 of the second device region 205. For example, in FIGS. 4 and 5, the width W2 of the second device region 205 may be determined by the width of the second base substrate 201 trimmed using the blade 50.

Figure 6:
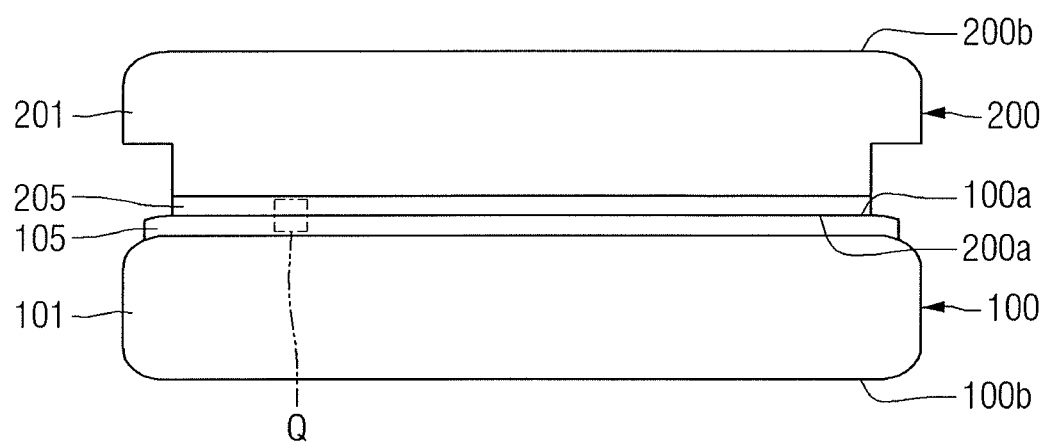
Figure 7:
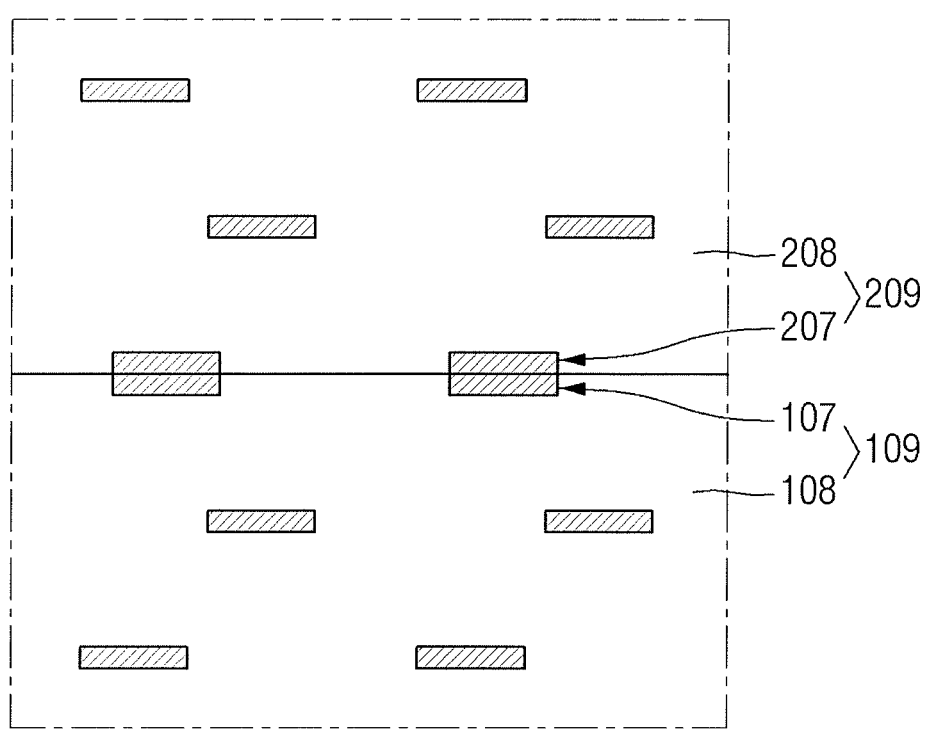

Referring to FIGS. 6 and 7, the first substrate 100 and the second substrate 200 may be bonded. The second substrate 200 may be bonded to the first substrate 100.

The first surface 100a of the first substrate 100 and the first surface 200a of the second substrate 200, which are disposed to face each other, may be bonded. Accordingly, the first substrate 100 and the second substrate 200 may be bonded. The first surface 200a of the second substrate 200 may be bonded to the first surface 100a of the first substrate 100.

In the method of manufacturing a substrate structure according to some embodiments of the present disclosure, the first substrate 100 and the second substrate 200 may be directly bonded, e.g., via annealing based on chemical bonds, surfaces activated bonding, etc. Here, the "direct bonding" means that the first substrate 100 and the second substrate 200 are directly bonded without an adhesive layer or connector formed on the first substrate 100 and/or the second substrate 200.

The first substrate 100 and the second substrate 200 are bonded to each other, thereby bonding the first device region 105 formed on the first surface 100a of the first substrate with the second device region 205 formed on the first surface 200a of the second substrate 200. The first surface 100a of the first substrate 100 and the first surface 200a of the second substrate 200 may be directly bonded to each other, such that the first device region 105 and the second device region 205 face each other. That is, as the first surface 100a of the first substrate 100 and the first surface 200a of the second substrate 200 define outer surfaces of the first device region 105 and the second device region 205, respectively, the first surfaces 100a and 200a directly contact each other, and the first and second device regions 105 and 205 directly contact each other.

The first substrate 100 and the second substrate 200 are bonded to each other, thereby directly bonding the first device region 105 and the second device region 205. As illustrated in FIG. 7, the first wiring structure 109 included in the first device region 105 may be directly bonded with the second wiring structure 209 included in the second device region 205.

The first substrate 100 and the second substrate 200 are bonded to each other, thereby electrically connecting the first device region 105 and the second device region 205. The first device region 105 and the second device region 205, directly bonded, are electrically connected. For example, the first wiring 107 included in the first device region 105 and the second wiring 207 included in the second device region 205 are connected to each other, thereby electrically connecting the first device region 105 and the second device region 205. The first interlayer insulating film 108 included in the first device region 105 and the second interlayer insulating film 208 included in the second device region 205 are in direct contact with each other, thereby directly bonding the first device region 105 and the second device region 205.

Although it is shown in FIG. 7 that each of the first wiring 107 included in the first device region 105 and the second wiring 207 included in the second device region 205 is a single-layer film, the present disclosure is not limited thereto. Further, although it is shown in FIG. 7 that the uppermost layer of the first wiring 107 and the uppermost layer of the second wiring 207, which are connected to each other, are directly bonded, the present disclosure is not limited thereto.

A thin conductive liner film capable of assisting attachment of the first wiring 107 and the second wiring 207 may be disposed between the first wiring 107 and the second wiring 207, which are bonded to each other. However, the conductive liner film may have a, e.g., negligible, thickness to such a degree that the direct bonding of the first surface 100a of the first substrate 100 and the second surface 200b of the second substrate 200 is not prevented. That is, the conductive liner film may not prevent the first interlayer insulating film 108 and the second interlayer insulating film 208 from being in direct contact and bonding.

In FIG. 6, in a state where the first substrate 100 and the second substrate 200 are bonded, the width of the second device region 205 is smaller than the width of the first device region 105. The second device region 205 having a small width is bonded to the first device region 105 having a large width, thereby preventing the misalignment of the first substrate 100 and the second substrate 200. For example, as illustrated in FIG. 6, the second substrate 200 may be aligned above the first substrate 100, such that the second device region 205 (having the smaller width) is centered above the first device region 105 (having the larger width. As such, once the second device region 205 is bonded to the first device region 105, edges of the first device region 105 extend, e.g., symmetrically, beyond edges of second device region 205, thereby preventing misalignment of edges if the first and second device regions 105 and 205. Accordingly, it is possible to prevent the second substrate 200 from not being bonded to the first substrate 100, e.g., as compared to failure to bond device regions having a same width due to misaligned edges.

Figure 8:
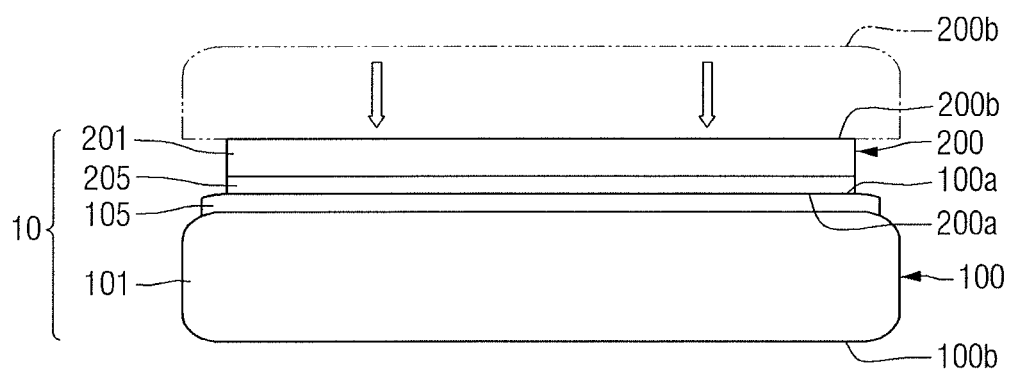

Referring to FIG. 8, in order to reduce the thickness of the second substrate 200, a part of the second substrate 200 bonded to the first substrate 100 may be removed, e.g., via grinding, chemical mechanical polishing (CMP), etching, etc. That is, the thickness of the second substrate 200 may be reduced by removing a part of the second base substrate 201, e.g., removing the dashed portion of the substrate 200 in FIG. 8. The thickness of the second substrate 200 is reduced, so that the resultant second surface 200b of the resultant thinner second substrate is closer to the second device region 205. Consequently, a first substrate structure 10 may be formed. In the state of the first substrate structure 10, the width of the first device region 105 may be greater than the width of the second device region 205, i.e., edges of the first device region 105 may extend beyond those of the second device region 205, while a width of the entire second substrate 200 equals the width of the second device region 205.

Figure 9A:
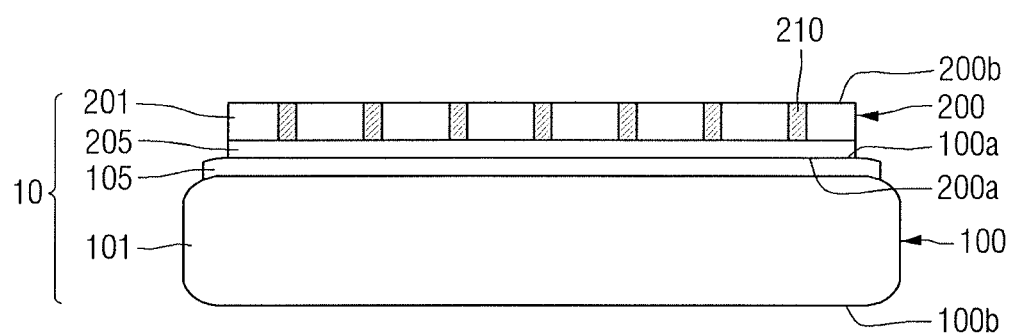
Figure 9B:
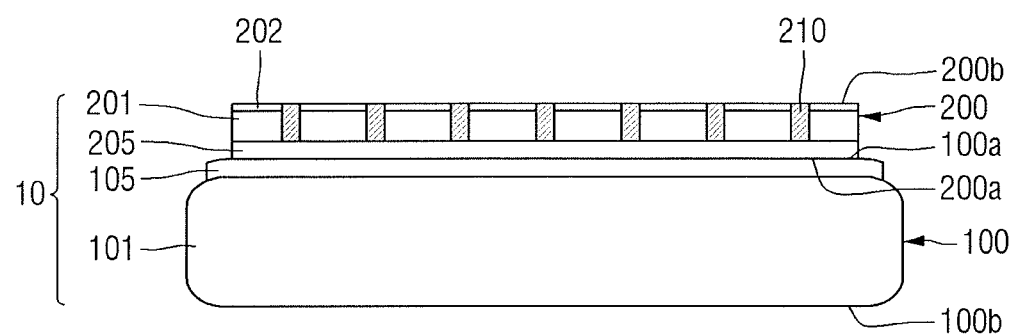

Referring to FIGS. 9A and 9B, a first penetrating electrode 210 electrically connected to the second device region 205 may be formed in the second substrate 200. The first penetrating electrode 210 may be formed in the second substrate 200 of the first substrate structure 10.

For example, the first penetrating electrode 210 may extend from the second surface 200b of the second substrate 200 to the second device region 205. The first penetrating electrode 210 may be formed by forming a via hole penetrating the second base substrate 201 and then filling the via hole with a conductive material. The first penetrating electrode 210 may be electrically connected with the first device region 105 through the second device region 205.

The first penetrating electrode 210 may contain, e.g., copper (Cu), aluminum (Al), and/or tungsten (W). A liner and a barrier film may be provided between the first penetrating electrode 210 and the second base substrate 201 which is a semiconductor material. The barrier film may contain at least one of, e.g., Ta, TaN, Ti, TiN, Ru, Co, Ni, NiB, or WN. The liner may contain, e.g., silicon oxide having a low dielectric constant or carbon-doped silicon oxide.

For example, in FIG. 9A, the second surface 200b of the second substrate 200 may be defined by the second base substrate 201 and the first penetrating electrode 210. For example, as illustrated in FIG. 9A, upper surfaces of the second base substrate 201 and the first penetrating electrode 210 may be level with each other to define the second surface 200b.

In another example, in FIG. 9B, the second substrate 200 may further include an adhesive insulation film 202 formed on the second surface 200b of the second substrate 200. The adhesive insulation film 202 may be formed on a surface of the second base substrate 201 that is opposite to the second device region 205. The adhesive insulation film 202 may be formed on the second surface 200b of the second substrate 200 having a reduced thickness.

The first penetrating electrode 210 may be formed to penetrate the second base substrate 201 and the adhesive insulation film 202. The second surface 200b of the second substrate 200 may be defined by the adhesive insulation film 202 and the first penetrating electrode 210. When the second substrate 200 is bonded to another substrate, the adhesive insulation film 202 may be used to bond the second substrate 200 with another substrate. The adhesive insulation film 202 may contain an insulating material.

The following descriptions will be conducted using the structure of FIG. 9A.

Figure 10:
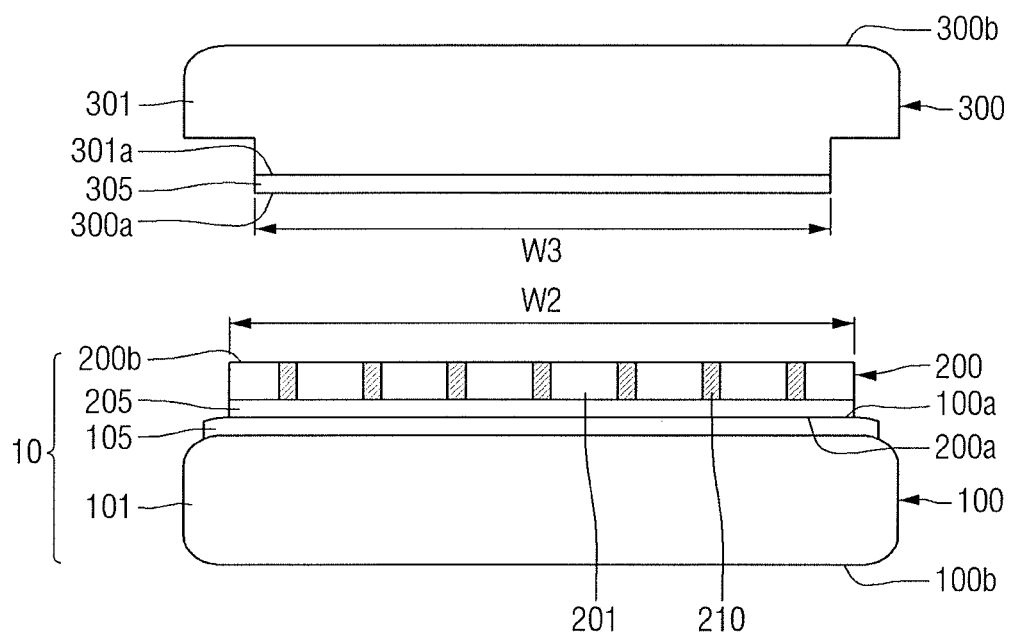

Referring to FIG. 10, a third substrate 300 including a third device region 305 may be provided. The third substrate 300 may include a first surface 300a and a second surface 300b, which face each other. The third substrate 300 includes a third base substrate 301 and the third device region 305 formed on the third base substrate 301.

The third device region 305 may be formed on the first surface 300a of the third substrate 300. That is, the first surface 300a of the third substrate 300 may be defined by the third device region 305.

The third device region 305 may be formed on a first surface 301a of the third base substrate 301. A second surface of the third base substrate 301, facing the first surface 301a of the third base substrate 301, may be the second surface 300b of the third substrate 300.

The third substrate 300 may include a plurality of die regions that may be a logic chip or a memory chip through a dicing process. The third device region 305, like the first device region 105, may include a circuit pattern and a wiring structure. For example, the third substrate 300 may be formed by the process having been described with reference to FIGS. 3 and 4.

Subsequently, the second substrate 200 bonded with the first substrate 100, and the third substrate 300 may be disposed such that the first surface 300a of the third substrate 300 faces the second surface 200b of the second substrate 200. The second substrate 200 bonded with the first substrate 100, and the third substrate 300 are disposed such that the third device region 305 formed on the first surface 300a of the third substrate 300 faces the second surface 200b of the second substrate 200.

In the method of manufacturing a substrate structure according to some embodiments of the present disclosure, the width W2 of the second device region 205 included in the second substrate 200 is different from a width W3 of the third device region 305. That is, the width W2 of the second substrate 200 is different from the width W3 of the third device region 305. For example, the width W2 of the second device region 205 may be larger than the width W3 of the third device region 305. The width W2 of the second substrate 200 whose thickness is reduced may be larger than the width W3 of the third device region 305.

Figure 11:
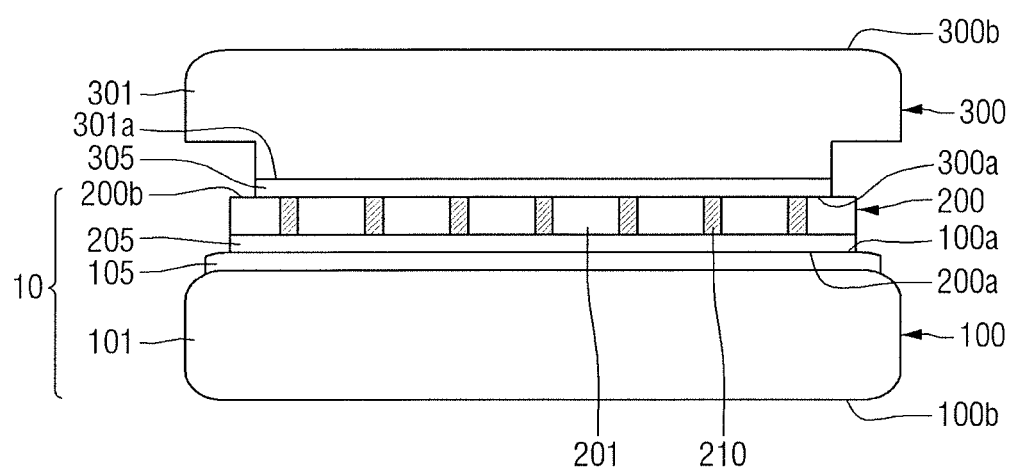

Referring to FIG. 11, the first substrate structure 10 and the third substrate 300 may be bonded. The third substrate 300 may be bonded to the first substrate structure 10. The third substrate 300 may be bonded to the second substrate 200.

The second surface 200b of the second substrate and the first surface 300a of the third substrate, disposed to face each other, may be bonded. Accordingly, the second substrate 200 and the third substrate 300 may be bonded. For example, the second substrate 200 and the third substrate 300 may be directly bonded, but the present disclosure is not limited thereto.

The first surface 300a of the third substrate 300 may be bonded to the second surface 200b of the second substrate 200. Accordingly, the first substrate 100, the second substrate 200, and the third substrate 300 may be bonded to each other.

The second substrate 200 and the third substrate 300 are bonded to each other, so that the third device region 305 may be bonded to the second surface 200b of the second substrate 200. For example, the third device region 305 may be electrically connected with the first penetrating electrode 210 in the second substrate 200.

The third device region 305 may be electrically connected to the second device region 205 through the first penetrating electrode 210. In addition, the third device region 305 may also be electrically connected to the first device region 105.

In FIG. 11, in a state where the second substrate 200 and the third substrate 300 are bonded, the width of the third device region 305 is smaller than the width of the second device region 205. The third device region 305 having a small width is bonded to the second device region 205 having a large width, thereby preventing the third substrate 300 from not being bonded to the second substrate 200.

Figure 12:
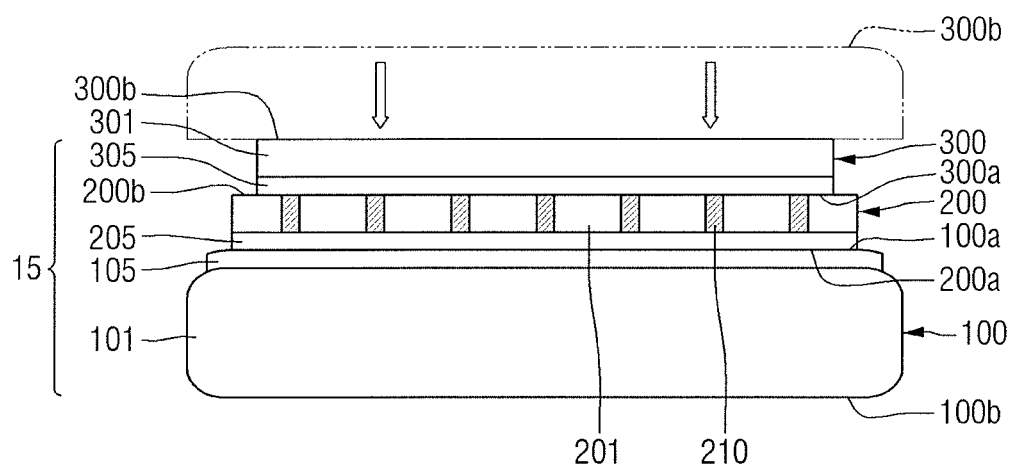

Referring to FIG. 12, in order to reduce the thickness of the third substrate 300, a part of the third substrate 300 bonded to the first substrate structure 10 may be removed. The thickness of the third substrate 300 may be reduced by removing a part of the third base substrate 301. The thickness of the third substrate 300 is reduced, so that the second surface 300b of the third substrate 300 is closer to the third device region 305.

A second substrate structure 15 may be formed by reducing the thickness of the third substrate 300 bonded to the first substrate structure. In the second substrate structure 15, the width of the second device region 205 may be greater than the width of the third device region 305.

Subsequently, as described with reference to FIGS. 9A and 9B, a penetrating electrode may be formed in the third substrate 300, but the present disclosure is not limited thereto. That is, a penetrating electrode may not be formed in the third substrate 300.

Figure 13:
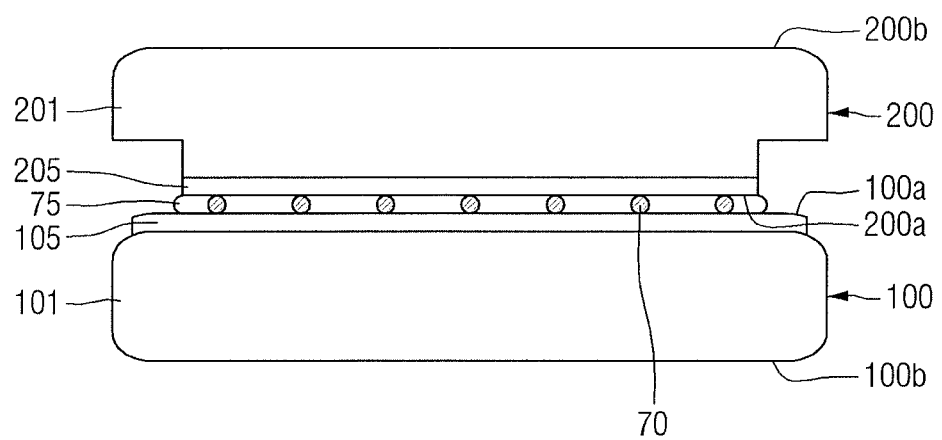
FIG. 13 illustrates an intermediate view in a method of manufacturing a substrate structure according to some embodiments.

FIG. 13 is an intermediate view for illustrating a method of manufacturing a substrate structure according to some embodiments of the present disclosure. For convenience of explanation, differences from those having been described with reference to FIGS. 1 to 12 will be mainly described.

For reference, FIG. 13 shows a process proceeding after FIG. 5.

Referring to FIG. 13, a conductive connector 70 for electrically connecting the first device region 105 and the second device region 205 may be formed between the first device region 105 of the first substrate 100 and the second device region 205 of the second substrate 200.

In the method of manufacturing a substrate structure according to some embodiments of the present disclosure, the first device region 105 and the second device region 205 may be electrically connected with each other through the conductive connector 70. That is, the first wiring (107 of FIG. 7) of the first device region 105 and the second wiring (207 of FIG. 7) of the second device region 205 may be electrically connected by the conductive connector 70. Differently explaining, the first device region 105 and the second device region 205 may not be directly electrically connected, but may be indirectly electrically connected through the conductive connector 70.

The first device region 105 and the second device region 205 may not be directly bonded because the conductive connector 70 is interposed between the first device region 105 and the second device region 205. In addition, the first surface 100a of the first substrate 100 and the first surface 200a of the second substrate 200 may be bonded by the conductive connector 70 without being directly bonded.

A sealing insulation film 75 for surrounding the periphery of the conductive connector may be formed between the first surface 100a of the first substrate 100 and the first surface 200a of the second substrate 200. The sealing insulation film 75 may serve to not only cover the conductive connector 70 but also bond the first surface 100a of the first substrate 100 and the first surface 200a of the second substrate 200.

Although it is shown in FIG. 13 that the conductive connector 70 has a ball shape, the present disclosure is not limited thereto. For example, the conductive connector 70 may have a pillar shape, and may also be a combination of a pillar-shaped first connector and a ball-shaped second connector. Subsequently, a process of reducing the thickness of the second substrate 200 may proceed.

Figure 14:
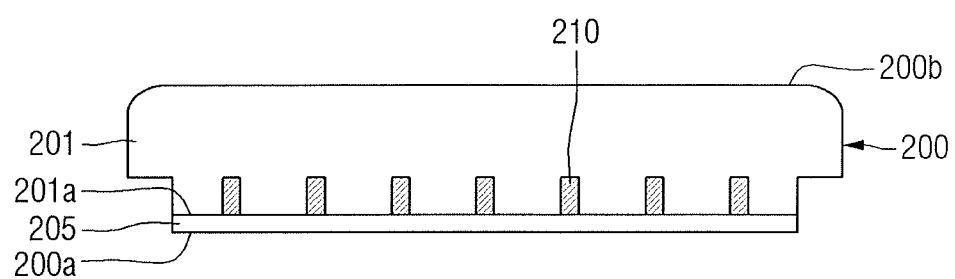
FIGS. 14 and 15 illustrate intermediate views in a method of manufacturing a substrate structure according to some embodiments.
Figure 14:
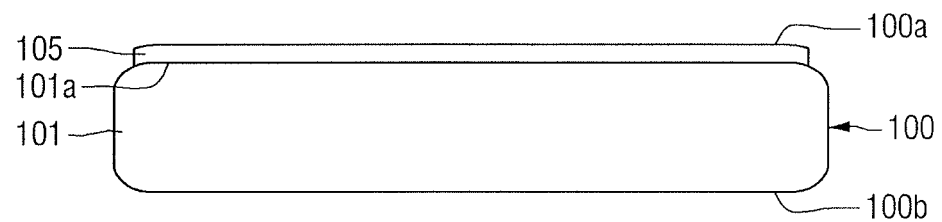
Figure 15:
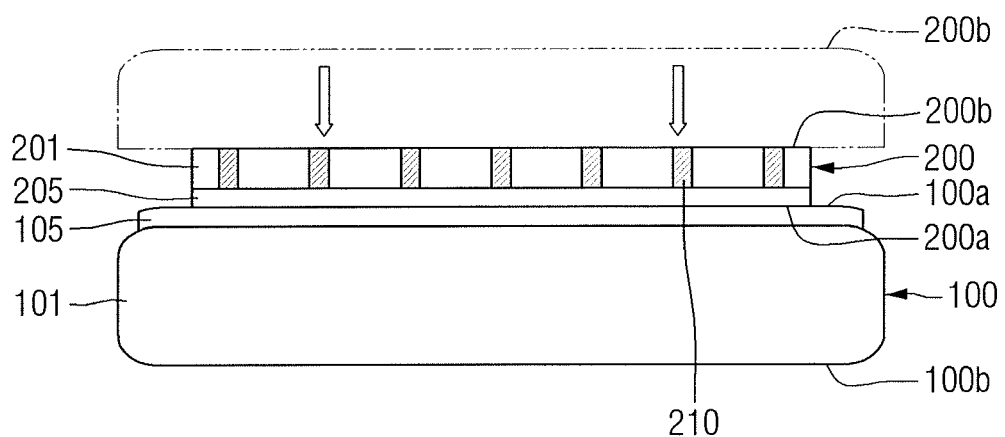

FIGS. 14 and 15 are intermediate views for illustrating a method of manufacturing a substrate structure according to some embodiments of the present disclosure. For convenience of explanation, differences from those having been described with reference to FIGS. 1 to 12 will be mainly described.

Referring to FIG. 14, the second substrate 200 including a first penetrating electrode electrically connected with the second device region 205 is provided. The second substrate 200, before being bonded to the first substrate 100, may include the first penetrating electrode 210 formed in the second substrate 200. Although it is shown in FIG. 14 that the first penetrating electrode 210 does not penetrate the second device region 205, the present disclosure is not limited thereto.

For example, the extending shape of the first penetrating electrode 210 may be changed according to whether the first penetrating electrode 210 is formed before a FEOL (front end of line) process or between a FEOL (front end of line) process and a BEOL (Back end of line) process. Further, the extending shape of the first penetrating electrode 210 may be changed according to whether the first penetrating electrode 210 is formed during or after a BEOL (Back end of line) process. Subsequently, the first substrate 100 and the second substrate 200 may be bonded.

Referring to FIG. 15 in order to reduce the thickness of the second substrate 200, a part of the second substrate 200 bonded to the first substrate 100 may be removed. While reducing the thickness of the second substrate 200, the first penetrating electrode 210 formed in the second substrate 200 may be exposed. That is, in order to expose the first penetrating electrode 210, a part of the second base substrate 201 may be removed.

Figure 16:
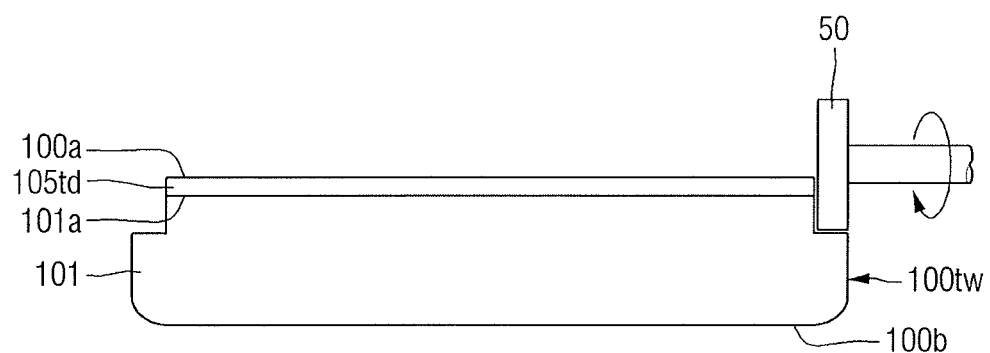
FIGS. 16 to 18 illustrate intermediate views in a method of manufacturing a substrate structure according to some embodiments.
Figure 17:
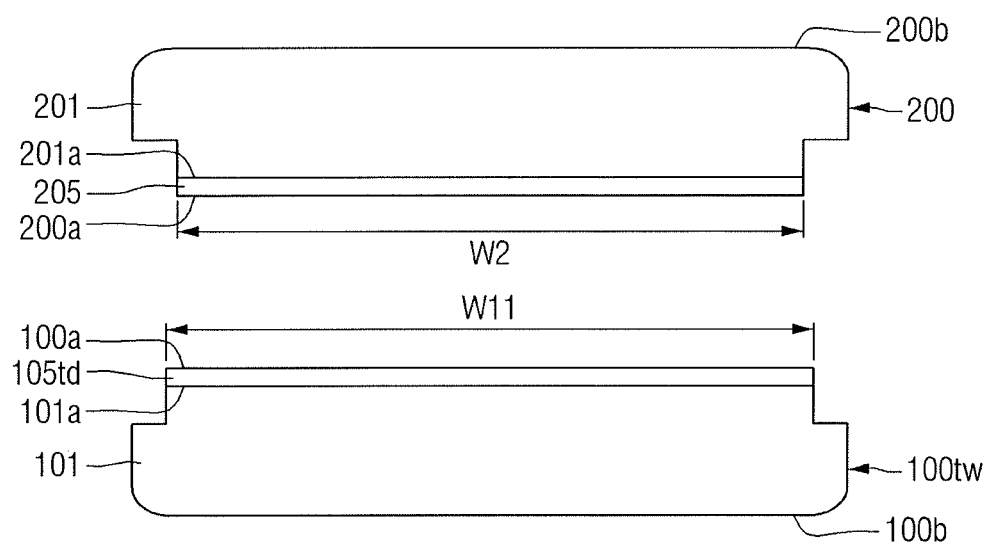
Figure 18:
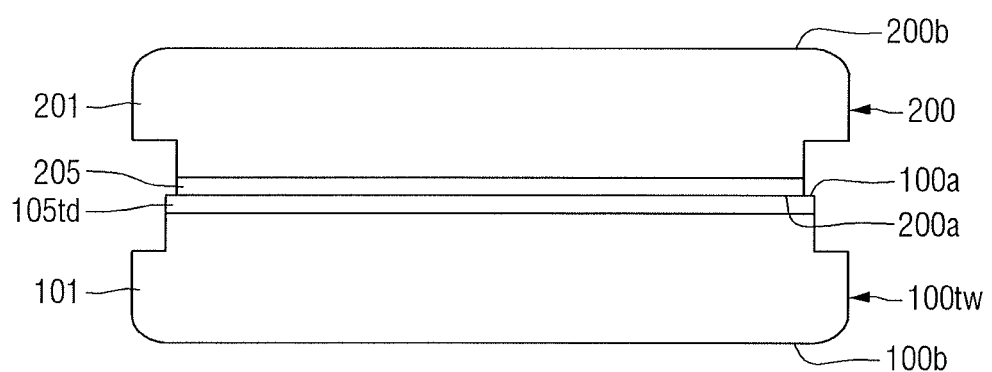

FIGS. 16 to 18 are intermediate views for illustrating a method of manufacturing a substrate structure according to some embodiments of the present disclosure. For convenience of explanation, differences from those having been described with reference to FIGS. 1 to 12 will be mainly described.

Referring to FIG. 16, a part of the first base substrate 101 and a part of the first device region 105 are trimmed, so as to form a first trim substrate 100tw. Through the trimming, a part of the edge of the first base substrate 101 may be removed in the thickness direction of the first base substrate 101. Further, through the trimming, the first device region 105 formed at the edge of the first base substrate 101 may be removed. Accordingly, a first trim device region 105td may be formed on the first surface 101a of the first base substrate 101.

For example, a part of the first base substrate 101 and a part of the first device region 105 may be mechanically trimmed. That is, a part of the first base substrate 101 and a part of the first device region 105 may be mechanically trimmed using the blade 50.

Through the trimming, a step that is recessed toward the second surface 100b of the first trim substrate 100tw from the first surface 101a of the first base substrate 101 may be formed. The first trim substrate 100tw includes the first surface 100a and the second surface 100b, which face each other. The first trim substrate 100tw includes the first base substrate 101 and the first trim device region 105td formed on the first base substrate 101.

The first surface 100a of the first trim substrate 100tw may be defined by the first trim device region 105td. The first trim device region 105td may be formed on the first surface 101a of the first base substrate 101. A second surface of the first base substrate 101, facing the first surface 101a of the first base substrate 101, may be the second surface 100b of the first trim substrate 100tw. Through a trimming process, there may be the first trim substrate 100tw including the first surface 100a of the first trim substrate 100tw and the second surface 100b of the first trim substrate 100tw, facing each other, and the first trim device region 100td formed on the first surface 100a of the first trim substrate 100tw.

Referring to FIG. 17, the first trim substrate 100tw and the second substrate 200 may be disposed such that the first surface 100a of the first trim substrate 100tw and the first surface 200a of the second substrate 200 face each other. The first trim substrate 100tw and the second substrate 200 are disposed such that the first trim device region 105td formed on the first surface 100a of the first trim substrate 100tw and the second device region 205 formed on the first surface 200a of the second substrate 200 face each other.

In the method of manufacturing a substrate structure according to some embodiments of the present disclosure, a width W11 of the first trim device region 105td and the width W2 of the second device region 205 may be different from each other. For example, the width W11 of the first trim device region 105td may be greater than the width W2 of the second device region 205.

Referring to FIG. 18, the first trim substrate 100tw and the second substrate 200 may be bonded. The second substrate 200 may be bonded to the first trim substrate 100tw.

The first surface 100a of the first trim substrate 100tw and the first surface 200a of the second substrate 200, which are disposed to face each other, may be bonded. Accordingly, the first trim substrate 100tw and the second substrate 200 may be bonded. The first surface 200a of the second substrate 200 may be bonded to the first surface 100a of the first trim substrate 100tw.

In the method of manufacturing a substrate structure according to some embodiments of the present disclosure, the first trim substrate 100tw and the second substrate 200 may be directly bonded. The first trim substrate 100tw and the second substrate 200 are bonded to each other, thereby bonding the first trim device region 105td formed on the first surface 100a of the first trim substrate 100tw with the second device region 205 formed on the first surface 200a of the second substrate 200. The first surface 100a of the first trim substrate 100tw and the first surface 200a of the second substrate 200 may be directly bonded such that the first trim device region 105td and the second device region 205 face each other.

The first trim substrate 100tw and the second substrate 200 are bonded to each other, thereby directly bonding the first trim device region 105td and the second device region 205. The first wiring structure (109 of FIG. 7) included in the first trim device region 105td may be directly bonded with the second wiring structure (209 of FIG. 7) included in the second device region 205.

The first trim substrate 100tw and the second substrate 200 are bonded to each other, thereby electrically connecting the first trim device region 105td and the second device region 205. The first trim device region 105td and the second device region 205, directly bonded, are electrically connected.

In a state where the first trim substrate 100tw and the second substrate 200 are bonded, the width of the second device region 205 is smaller than the width of the first trim device region 105td. The second device region 205 having a small width is bonded to the first trim device region 105td having a large width, thereby preventing the misalignment of the first trim substrate 100tw and the second substrate 200. Accordingly, it is possible to prevent the second substrate 200 from not being bonded to the first trim substrate 100tw. Subsequently, the thickness of the second substrate 200 may be reduced by removing a part of the second substrate 200 bonded to the first trim substrate 100tw.

Figure 19:
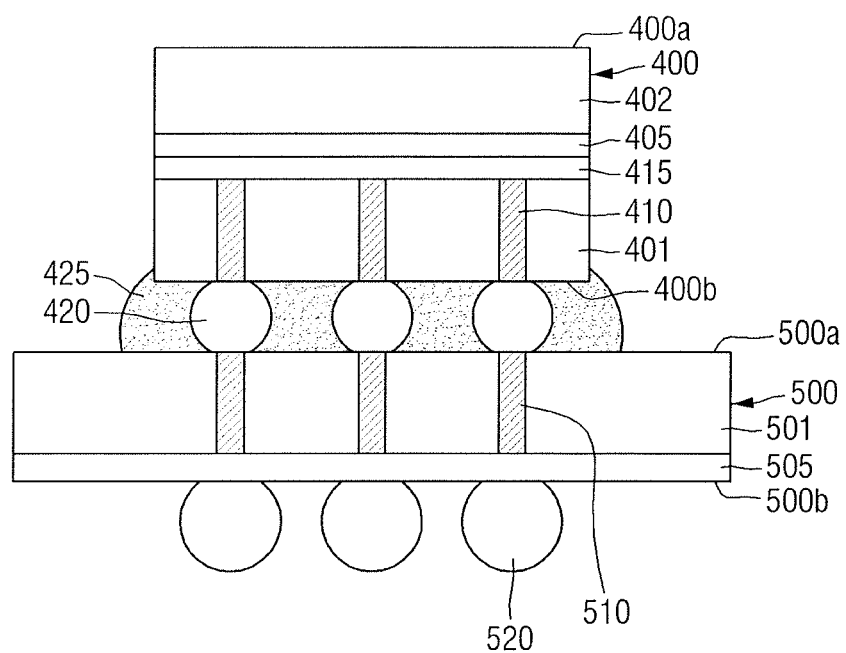
FIG. 19 illustrates an exemplary view of a semiconductor package manufactured using a method of manufacturing a substrate structure according to some embodiments.

FIG. 19 is an exemplary view for illustrating a semiconductor package manufactured using a method of manufacturing a substrate structure according to some embodiments of the present disclosure.

Referring to FIG. 19, a semiconductor package according to some embodiments of the present disclosure may include a first semiconductor chip 400 and a second semiconductor chip 500.

The first semiconductor chip 400 may include a first surface 400a and a second surface 400b, which face each other. The first semiconductor chip 400 may include a fourth upper device region 405 and a fourth lower device region 415, which are bonded to each other.

The first semiconductor chip 400 may include a fourth upper base substrate 402 adjacent to the fourth upper device region 405, and a fourth lower base substrate 401 adjacent to the fourth lower device region 415. The first surface 400a of the first semiconductor chip 400 is defined by the fourth upper base substrate 402, and the second surface 400b of the first semiconductor chip 400 is defined by the fourth lower base substrate 401.

The first semiconductor chip 400 may include a second penetrating electrode 410. For example, the second penetrating electrode 410 may be formed in the fourth lower base substrate 401, but the present disclosure is not limited thereto. That is, the second penetrating electrode 410 may also be formed in the fourth upper base substrate 402. The second penetrating electrode 410 may be electrically connected with the fourth upper device region 405 and the fourth lower device region 415.

Although it is shown FIG. 19 that the first semiconductor chip 400 is similar to that obtained by dicing the first substrate structure 10, the present disclosure is not limited thereto. That is, the first semiconductor chip 400 may be any one of those obtained by dicing the substrate structure formed by the method of manufacturing a substrate structure having described with reference to FIGS. 1 to 18.

The second semiconductor chip 500 may include a first surface 500a and a second surface 500b, which face each other. The second semiconductor chip 500 may include a fifth device region 505.

The second semiconductor chip 500 may include a third penetrating electrode 510 formed on a fifth base substrate 501. The first surface 500a of the second semiconductor chip 500 may face the second surface 400b of the first semiconductor chip 400.

A first connection terminal 420 is disposed between the first semiconductor chip 400 and the second semiconductor chip 500. The first connection terminal 420 is located between the first surface 500a of the second semiconductor chip 500 and the second surface 400b of the first semiconductor chip 400. The first connection terminal 420 electrically connects the first semiconductor chip 400 and the second semiconductor chip 500.

A fixing film 425 is formed between the first surface 500a of the second semiconductor chip 500 and the second surface 400b of the first semiconductor chip 400. The fixing film 425 may cover a part of the side wall of the first semiconductor chip 400, but the present disclosure is not limited thereto.

A second connection terminal 520 is formed on the second surface 500b of the second semiconductor chip 500. The second connection terminal 520 is electrically connected with the fifth device region 505.

By way of summation and review, aspects of the present disclosure provide a method of manufacturing a substrate structure, which can prevent upper and lower substrates from not being bonded to each other at the time of bonding a plurality of substrates. That is, edges of the upper wafer are more trimmed than those of the lower wafer bonded thereto. As a result, stacking is performed in the form of a pyramid whose width becomes narrower toward the upper wafer, thereby preventing edge failure, e.g., preventing defects due to unbonding of stacked wafers caused by misalignment of edges (e.g., edge step difference).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a substrate structure, the method comprising:
   providing a first substrate including a first surface and a second surface, facing each other, and a first device region formed on the first surface;
   providing a second substrate including a third surface and a fourth surface, facing each other, and a second device region formed on the third surface;
   bonding the first substrate and the second substrate to electrically connect the first device region and the second device region; and
   reducing a thickness of the second substrate, after bonding the first and second substrates,
   wherein a width of the first device region is greater than a width of the second device region in a state where the first substrate is bonded with the second substrate whose thickness is reduced, and,
   wherein the second substrate includes a penetrating electrode, and the penetrating electrode is exposed during reducing the thickness of the second substrate.

2. The method as claimed in claim 1, wherein bonding the first substrate and the second substrate includes directly bonding the first substrate and the second substrate.

3. The method as claimed in claim 2, wherein directly bonding the first substrate and the second substrate includes:
disposing the first substrate and the second substrate such that the first surface of the first substrate faces the third surface of the second substrate; and
bonding the first device region and the second device region.

4. The method as claimed in claim 2, wherein directly bonding the first substrate and the second substrate includes:
disposing the first substrate and the second substrate such that the second surface of the first substrate faces the third surface of the second substrate; and
bonding the second device region to the second surface of the first substrate.

5. The method as claimed in claim 1, wherein providing the first substrate includes:
forming a first pre-device region on a first surface of a first base substrate; and
trimming a part of the first base substrate and a part of the first pre-device region.

6. The method as claimed in claim 5, wherein providing the second substrate includes:
forming a second pre-device region on a first surface of a second base substrate; and
trimming a part of the second base substrate and a part of the second pre-device region.

7. The method as claimed in claim 1, further comprising:
providing a third substrate including a fifth surface and a sixth surface, facing each other, and a third device region formed on the fifth surface; and
bonding the third substrate to the second substrate to electrically connect the second device region and the third device region,
wherein a width of the second device region is greater than a width of the third device region.

8. The method as claimed in claim 1, wherein:
the first device region and the second device region are electrically connected to a conductive connector formed on the third surface of the second substrate, and
bonding the first substrate and the second substrate includes forming a sealing insulation film between the first surface of the first substrate and the third surface of the second substrate to surround a periphery of the conductive connector.

9. The method as claimed in claim 1, further comprising forming a penetrating electrode electrically connected with the second device region in the second substrate, after electrically connecting the first device region and the second device region.

10. A method of manufacturing a substrate structure, the method comprising:
providing a first substrate including a first device region formed on a first surface;
providing a second substrate including a second device region formed on a second surface, such that a width of the second device region is smaller than a width of the first device region;
directly bonding the first surface of the first substrate and the second surface of the second substrate, such that the first device region and the second device region face each other; and
reducing a thickness of the second substrate bonded with the first substrate to form a first substrate structure,
wherein the second substrate includes a penetrating electrode, and the penetrating electrode is exposed during reducing the thickness of the second substrate.

11. The method as claimed in claim 10, wherein directly bonding the first and second substrates includes directly bonding the first device region and the second device region to electrically connect the first device region and the second device region, such that edges of the first substrate extend beyond respective edges of the first device region, and edges of the first device region extend beyond respective edges of the second device region.

12. The method as claimed in claim 10, further comprising:
providing a third substrate including a third device region formed on a third surface;
bonding the first substrate structure and the third surface of the third substrate to electrically connect the second device region and the third device region; and
reducing a thickness of the third substrate bonded to the first substrate structure to form a second substrate structure.

13. The method as claimed in claim 10, wherein providing the second substrate includes:
forming a pre-device region on a first surface of a base substrate; and
trimming a part of the base substrate and a part of the pre-device region.

14. The method as claimed in claim 13, wherein a part of the base substrate and a part of the pre-device region are mechanically trimmed.

15. A method of manufacturing a substrate structure, the method comprising:
providing a first substrate including a first device region on a first surface;
providing a second substrate including a second device region on a second surface, such that a width of the first device region is greater than a width of the second device region;
bonding the first substrate and the second substrate, such that the first and second device regions are facing each other and are electrically connected to each other; and
reducing a thickness of the second substrate bonded with the first substrate,
wherein the second substrate includes a penetrating electrode, and the penetrating electrode is exposed during reducing the thickness of the second substrate.

16. The method as claimed in claim 15, wherein bonding the first substrate and the second substrate includes directly bonding the first and second device regions to each other, the first device region including a different circuit pattern from that of the second device region.

17. The method as claimed in claim 16, wherein bonding the first substrate and the second substrate includes aligning the first and second device regions such that edges of the first device region extend beyond respective edges of the second device region.

18. The method as claimed in claim 15, wherein providing the second substrate includes trimming the second substrate with the second device region, such that a portion of the second substrate has lateral edges level with those of the second device region to have the width of the first device region greater than the width of the second device region.

19. The method as claimed in claim 18, wherein reducing the thickness of the second substrate is such that a width of the entire second substrate equals the width of the second device region.

* * * * *